United States Patent [19]

Fox

[11] 4,188,547
[45] Feb. 12, 1980

[54] MULTI-MODE CONTROL LOGIC CIRCUIT FOR SOLID STATE RELAYS

[75] Inventor: David A. Fox, Shawnee Township, Allen County, Ohio

[73] Assignee: Westinghouse Electric Corp., Pittsburgh, Pa.

[21] Appl. No.: 856,155

[22] Filed: Nov. 30, 1977

Related U.S. Application Data

[63] Continuation of Ser. No. 698,227, Jun. 21, 1976, abandoned.

[51] Int. Cl.² .................... H03K 5/153; H03K 17/18; H03K 17/60; H01H 47/18
[52] U.S. Cl. ........................... 307/239; 307/216; 307/254; 307/270; 307/362
[58] Field of Search ............... 307/203, 213, 216, 293, 307/239, 252 UA, 253, 254, 255, 270, 272

[56] References Cited

U.S. PATENT DOCUMENTS

| | | | |
|---|---|---|---|
| 3,286,030 | 11/1966 | Puckett et al. | 307/255 X |
| 3,660,695 | 5/1972 | Schmitt | 307/254 X |
| 3,678,291 | 7/1972 | Coe | 307/254 X |
| 3,723,769 | 3/1973 | Collins | 307/252 UA |
| 3,890,512 | 6/1975 | Kumakawa et al. | 307/203 |
| 3,898,552 | 8/1975 | Baker | 361/98 X |
| 3,963,947 | 6/1976 | Bogel | 307/293 |
| 3,987,316 | 10/1976 | Bogel et al. | 307/293 |
| 4,007,378 | 2/1977 | Lazzara | 307/203 X |
| 4,010,386 | 3/1977 | Rossell | 307/252 UA |
| 4,048,522 | 9/1977 | Gary et al. | 307/293 |

Primary Examiner—Larry N. Anagnos
Attorney, Agent, or Firm—G. H. Telfer

[57] ABSTRACT

For providing an interface between a low level input control signal and a power switch, a control logic circuit is presented for permitting operation of a solid state relay in any one of a plurality of modes of operation including operation as either a normally open relay, a normally closed relay, or a latching relay, and also to make possible combinations of such relays for operation in parallel with a second relay operating in or out of phase with a first relay. The control logic circuit includes logic gates with means for selective interconnection of external terminals to set the operation in the desired mode as well as to permit one relay to be responsive to the condition of another.

8 Claims, 11 Drawing Figures

MULTI-MODE CONTROL LOGIC CIRCUIT FOR SOLID STATE RELAYS

GOVERNMENT CONTRACT

This invention was made under a contract with the National Aeronautics and Space Administration.

This is a continuation of application Ser. No. 698,227 filed June 21, 1976, now abandoned.

BACKGROUND OF THE INVENTION

This invention relates to electronic circuitry for control of electrical power and particularly to digital logic circuitry for controlling the mode of operation of a solid state relay.

In electrical power systems there has been increasing interest in the use of solid state relays for controlled energization of a load from a power supply. For DC circuits, this usually takes the form of some kind of transistorized switching circuit such as is shown in Baker U.S. Pat. No. 3,898,552, issued Aug. 5, 1975.

In various applications, different modes of operation are required from a solid state relay. While the same basic power switching circuit may be employed generally in each of these modes of operation, they each require a different sort of control circuit in order to make the power switch operate in the required manner.

The functions desired of a solid state relay are directly analogous to the functions of electromechanical relays. The required functions include those referred to as normally open (NO), normally closed (NC), and latched. In normally open operation, the solid state relay (SSR) is to be OFF or to present an open circuit between the source and the load unless and until a control signal is applied to the power switch to close it and complete the circuit between the source and the load. In the normally open mode, the power switch will remain closed only so long as such a control signal is applied to it. In normally closed operation, the converse is to occur with the switch ON and the load circuit closed except when a control signal of a certain type is present that causes and maintains interruption of the load circuit. In both the normally open and normally closed modes of operation, a change of state of the relay occurs only as a result of a change in the applied control signal. In the third mode of operation, the latched mode, it is the case that the state of the relay can be changed by application of a control signal and will remain in the same changed state when the control signal is removed until a further control signal is applied to change the state again.

All of the types of operation referred to in the preceding paragraph relate to relays that may be called single pole, single throw (SPST) relays because the operation of the relay is to connect or disconnect between a single line or power pole and a single load. There are, however, systems that require operation between a plurality of lines and a single load or a single line and a plurality of loads with some interrelation of the individual relay functions such that one is to remain in or out of phase with the other. For this purpose, it is necessary that the relays be adapted for associating different control circuits in master-slave relationship.

Because of the number and variety of functions desired of an SSR, it has been previously necessary to make and use different specific control circuits for different ones of the required SSR functions with the natural consequence of poor economics as compared with a single circuit that could serve multiple purposes.

SUMMARY OF THE INVENTION

In accordance with the present invention, a multi-mode control logic circuit provides the interface between a low level input control signal and a power switch in a solid state relay. Any one of a plurality of modes of operation is made possible with a single control circuit, including operation as either a normally open relay, a normally closed relay, or a latching relay. The same control circuit also makes possible combinations of such relays for operation in parallel with a second relay operating in or out of phase with a first relay.

The control logic circuit includes digital logic gates and associated components, preferably in a single package with certain internal interconnections within the package being fixed but also with a plurality of external terminals extending from the package. The external terminals are distinctly identified and include one terminal referred to as a "mode" terminal which is associated with the internal logic gates in such a manner that the external connection of the mode terminal to a line terminal (i.e., on the supply side of the power switch) provides a control circuit for normally open relay operation. The mode terminal is, alternatively, connectable to a power ground terminal in order to achieve normally closed operation. The mode terminal may also be left unconnected, in which case, a latching relay results.

The differences in operation result because the mode terminal has a fixed connection internally in the package to one input of a logic gate which may be an "exclusive OR" gate whose output is a "1" when any one but not all its inputs has a "1" on it. The use of an "exclusive OR" gate gives the mode terminal the functions as just described in the circuit to be specifically described as an example hereafter. Other logic gates may be used and may be associated with the rest of the control logic circuitry such that the mode terminal achieves other modes of operation than those referred to. The point is that circuits in accordance with the present invention take advantage of the fact that by having a logic gate with an externally available terminal (the mode terminal) one may achieve any of the different modes of relay operation by tying that terminal to a point which maintains a "1" on that input to the gate (e.g., by tying it to the supply or line), or to a point that maintains a "zero" (e.g., power ground), or by leaving that terminal unconnected (not tied to "1" or "zero") but, internally, that gate input sees a "1" or a "zero" according to the state of other internal elements in the control logic circuit.

In addition to the mode terminal, circuits in accordance with this invention have separate "master" and "slave" terminals available for interconnecting between the two relay units to achieve the required two pole arrangements. The master terminal is one that bears an output "1" or "zero" from an internal logic gate. This output signal may be the same or different, by choice of design of the internal circuitry, than the output of the control logic circuit that goes to the power switch. The master output terminal, when used, is connected to the slave terminal, or slave input terminal, of another relay's control logic circuit. The second control logic circuit therefore has one of its logic gates with an input tied to an output of the first so they can be made to operate in or out of phase.

Since the control logic circuits in accordance with this invention need include only a relatively small number of individual logic gates and their associated components, they may be readily miniaturized and included in a single package along with the rest of the relay components. All required functions are provided by use of eight external terminals: line, load, control input, control ground, mode, master output, slave input and power ground. Control logic circuits in accordance with this invention therefore provide much greater flexibility in use than if distinct control logic circuits were required for each individual mode of operation.

THE DRAWING

PREFERRED EMBODIMENTS

Figure 1:
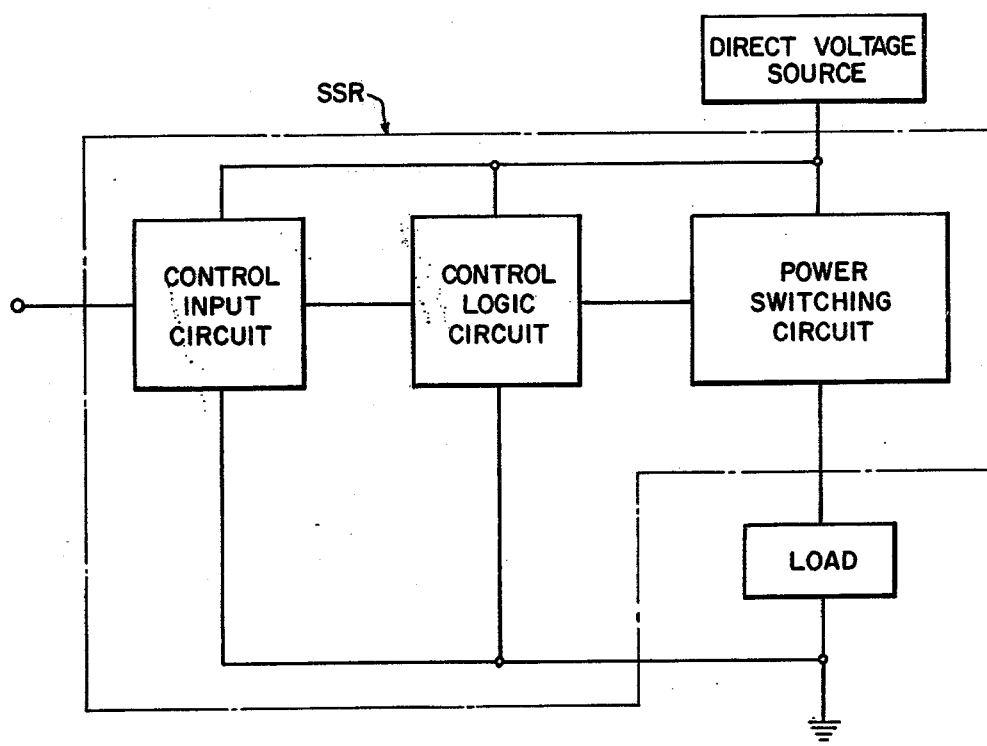
FIG. 1 is a general schematic diagram of a solid state relay in which the present invention may be incorporated.

Referring to FIG. 1, there is shown a generalized circuit schematic of a solid state relay (SSR) connected between a Direct Voltage Source and a Load. The SSR principally comprises a Power Switching Circuit that is directly connected between the Source and Load and has a control input from a Control Logic Circuit which in turn has an input from a Control Input Circuit.

The Control Input Circuit is one that is responsive to some system condition to produce a signal which may influence the operation of the relay. Copending application Ser. No. 698,253, filed June 21, 1976, by Fox et al and assigned to the present assignee now U.S. Pat. No. 4,086,503, issued Apr. 25, 1978, discloses a suitable Control Input Circuit. All references herein to sources of additional description are intended to incorporate the descriptions thereof in their entirety. The Control Input Circuit preferably also includes means providing electrical isolation between the source of input signal and the Control Logic Circuit.

The Control Logic Circuit preferably includes at its input a threshold sensing circuit portion for determining if the character (for example, the magnitude and polarity) of the signal from the Control Input Circuit is of the type desired for the operation of the Control Logic Circuit. The Control Logic Circuit principally includes logic gates for producing a signal applied to the Power Switching Circuit in accordance with a predetermined logic design.

The Power Switching Circuit may take various forms in accordance with known practice of which one preferred form is generally in accordance with Baker U.S. Pat. No. 3,898,552, issued Aug. 5, 1975.

It is particularly to the Control Logic Circuit that the present invention is directed. Although of more general utility, the invention will be principally described by an example of a circuit developed for use where high reliability (e.g., good noise immunity), low power dissipation, and suitability for miniturization are important, such as in aerospace applications.

Figure 2:
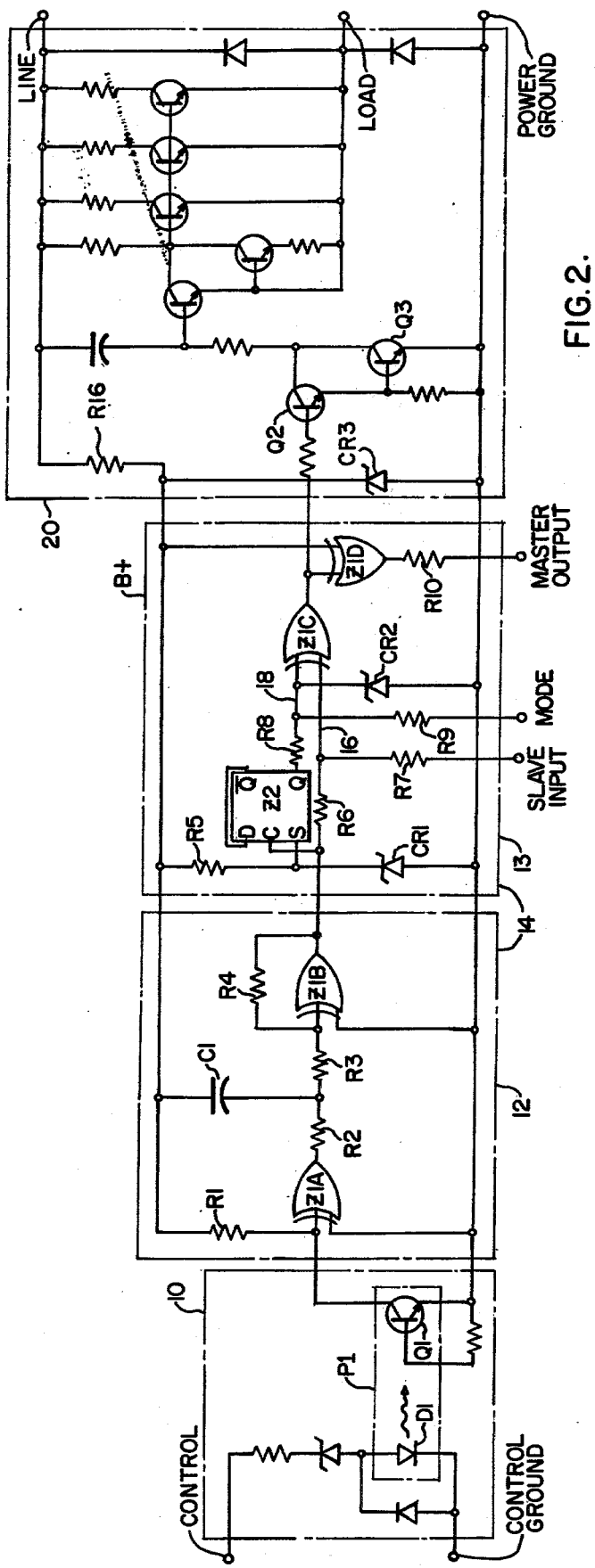
FIG. 2 is a schematic diagram of a solid state relay including an embodiment of the present invention.

Referring to FIG. 2, a circuit schematic is shown of an example of an SSR including a Control Logic Circuit in accordance with one embodiment of the present invention. The input is developed by a control input circuit 10 that may, for example, include an optical isolator P1, but which could instead have a transistor, op-amp, or a relay for the purpose.

Optical isolator P1 provides electrical isolation which is desirable. The Control and Control Ground terminals have no coupling to the rest of the SSR except through P1. The Control terminal in this example receives a signal from elsewhere, such as the trip circuit of Fox U.S. Pat. No. 3,697,813, but that trip circuit could also be incorporated in the relay package as part of the control input circuit; also see the referred to copending application Ser. No. 698,253.

When control current begins to flow through the light emitting diode D1 of P1, radiation turns on the photo transistor Q1 of P1. When the transistor portion of P1 begins to turn on, its collector voltage will drop to the threshold of Z1A which is an exclusive OR gate connected as a non-inverting (or buffer) amplifier.

The output of Z1A goes to "zero" when the control signal is applied (both inputs "zero") and now begins to charge capacitor C1 at a rate determined by the current source capability of Z1A and the size of capacitor C1. This controlled fall time provides the required control noise immunity for the circuit. Since Z1A acts as a controlled current source in both the high and low states, symmetrical noise immunity is obtained.

The voltage across C1 is sensed by Z1B, also an exclusive OR gate connected as a non-inverting amplifier. Z1B, along with R3 and R4, forms a Schmitt trigger with positive snap action around the threshold voltage of Z1B. This provides a clean logic signal for the remainder of the control circuit. Z1A has a pair of inputs of which one is connected to the regulated B+ supply through resistor R1 and to the collector of phototransistor Q1. The other input of Z1A is connected to the power ground. Z1B also has an input connected to the power ground while its other input is connected through resistors R2 and R3 to the output of Z1A and resistor R4 is connected in a circuit branch between that input and the output of Z1B. Capacitor C1 is connected from the B+ line to a point between resistors R2 and R3. The elements Z1A, Z1B, R1, R2, R3, R4 and C1, connected as shown, may be referred to as the threshold sensing portion 12 of a control logic circuit 14 which also includes logic circuit portion 13 in which are located the principal elements of the invention.

The logic circuit portion 13 includes exclusive OR logic gates Z1C and Z1D of which Z1C may be regarded as the "main" gate as it is operative in all modes and combinations. It has an input 16 with a fixed connection, through R6, to the output of Z1B. The same input 16 is connected to the the output of Z1B. The same input 16 is connected to the slave input terminal of the relay through resistor R7. The output of Z1C goes to the power switch as well as to one input of Z1D. Z1D is an "auxiliary" gate operative only when the illustrated relay is connected from the output of Z1D (the Master Output terminal) to another relay as will be described.

The main gate Z1C has a second input 18 that is permanently connected, through R8, to Z2 at terminal Q. Z2 is a D type flip-flop connected to toggle. The toggling action occurs when the clock input (C) of Z2 goes positive. Input 18 of Z1C is also connected through R9 to the external mode terminal.

Before proceeding with the description of logic circuit 13, Power Switching Circuit 20 should be introduced primarily to show how the Line, Load, and Power Ground terminals come out of the relay. While a specific example of switch 20 is shown for completeness, it is generally in accordance with the referred to Baker patent and will not be discussed in detail.

Figure 3:
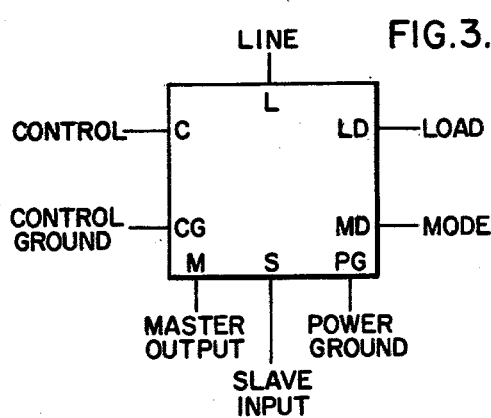
FIGS. 3 to 6 are schematic diagrams of single unit relays in accordance with this invention.
Figure 4:
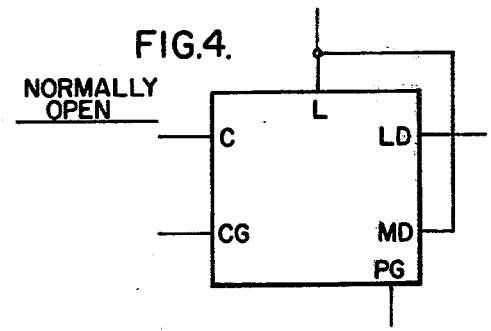

The SSR of FIG. 2 will now be recognized to include the building blocks of FIG. 1 and will also be seen to have eight external terminals illustrated in FIG. 3. Here the SSR is contained in a unitary package with the eight terminals identified on the package in some manner, such as:

L—Line; LD—Load
MD—Mode; PG—Power Ground
S—Slave Input; M—Master Input
CG—Control Ground; C—Control Proceeding now to a description of operation of the logic circuit portion 13:

With no connection to the Slave Input and with the Mode input tied to Line, as shown in FIG. 4, the output of Z1B goes through R6 to Z1C which, with a "one" on the Mode input, acts as an inverter. The output of Z1C, in phase with the Control Input, then goes to "one" and turns on Q2 and Q3 which control the power state 20. Thus the SSR acts as a Normally Open switch in the connection of FIG. 4. Resistors R8 and R9 are sized such that inputs at the Mode input dominate over any signals from Z2.

Figure 5:
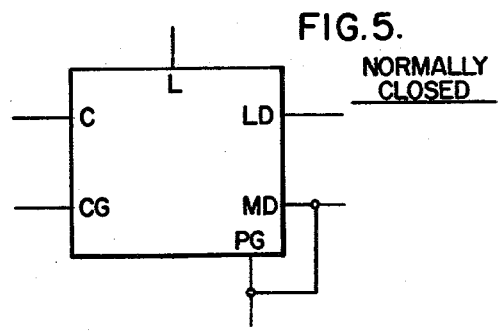

If the Mode input is connected to Power Ground, as shown in FIG. 5, Z1C becomes non-inverting, and the switch becomes Normally Closed.

Figure 6:
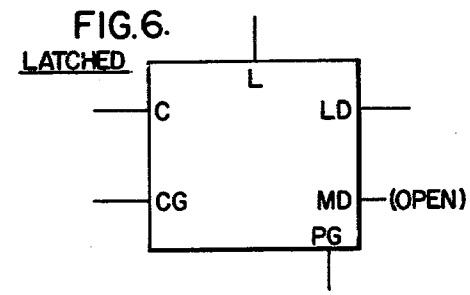
Figure 7:
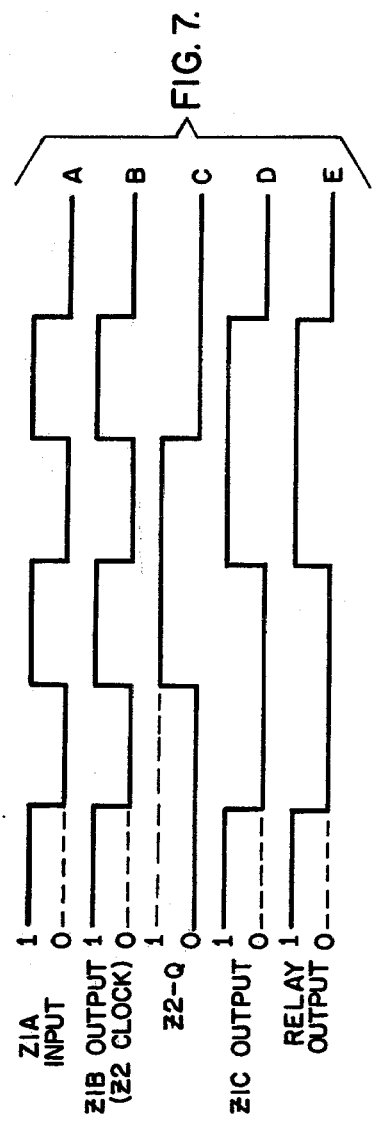
FIG. 7 is a set of waveforms for understanding the operation of the relay in the mode of FIG. 6; and, FIGS. 8 to 11 are schematic diagrams of master-slave combinations of relays in accordance with the present invention.

If the Mode terminal is left open, FIG. 6, the function of the circuit is best understood by reference to the waveforms of FIG. 7. Waveform A shows a possible shape of the input signal to Z1A, ignoring noise, and B is the Z1B output which follows the input Z1A and is applied to the Z2 clock at terminal C of Z2.

With the Mode terminal open, the output of Z2 at terminal Q (wave C) is now effective. It and the output of Z1B are connected to the inputs 16 and 18 of exclusive OR gate Z1C whose output is as shown at wave D. The switch thus toggles on and off only at the falling edge of the Z1A input signal thus providing Latched operation of the relay (wave E). The initial state of the switch is determined by the connection of CR1 and R5 to the input terminal S of Z2.

Figure 8:
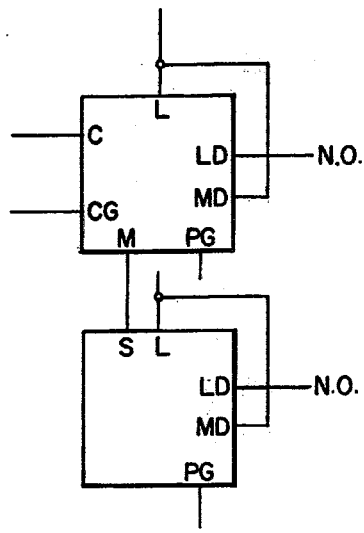
Figure 9:
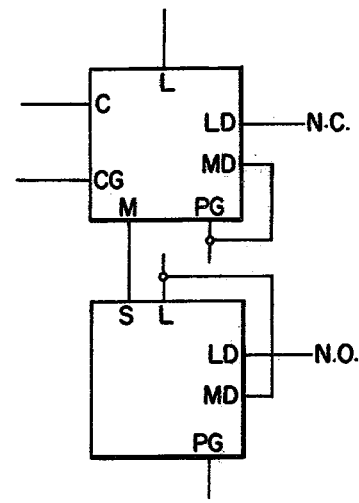
Figure 10:
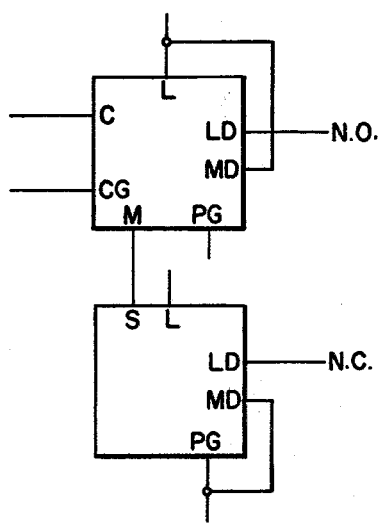
Figure 11:
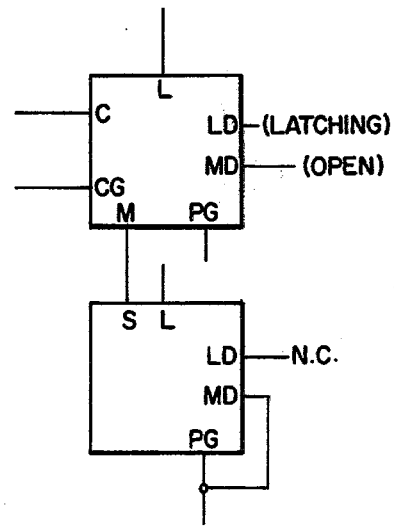

Gate Z1D is connected as an inverter to provide a Master output signal inverted with respect to the state of Z1C ("one" when Z1C is off). The Slave input is designed, through R6 and R7, to override normal control input signals and to directly control the state of Z1C. With the Mode control connected to the Line input (FIGS. 8 and 9), a Slave switch will assume the same state as the Master it is connected to. With the Mode control connected to Power Ground (FIGS. 10 and 11), a Slave switch will assume the opposite state as the Master it is connected to.

Power for the control logic is derived from the line input through R16 and regulated by CR3.

The following table summarizes the operation of the SSR in the various connections described:

| | Function | Connect Mode Terminal To |
|---|---|---|
| Single Unit | or Master Normally Open | Line |
| Single Unit | or Master Normally Closed | Power Ground |
| Single Unit | or Master Latching | (Not Connected) |
| Slave Unit | Non-Inverting | Line |
| Slave Unit | Inverting | Power Ground |

The following table identifies components, merely by way of further example, suitable for use in the Control Logic circuit 14 of FIG. 2 and operable to meet the following requirements:

Control voltage: 16–32 v. DC
Control current: less than 50 mA
Control isolation: greater than 5000 Mohm
Control Noise Immunity: 1–5 m Sec.

Components:
Resistors R1 and R4: 1 Megohm
Resistors R2 and R5: 20,000 ohms
Resistors R3, R6 and R8: 100,000 ohms
Resistors R7, R9 and R10: 10,000 ohms
Capacitor C1: 0.1 microf.
Zener diode CR1: 3.3 V.
Zener diode CR2: 8.2 V.
Exclusive-OR gates Z1: MC 14507
D Flip-Flop Z2: MC 14013

The circuit in accordance with this invention is particularly advantageous because all of the electrical components of the entire relay can be mounted on a single substrate in a single package. The general nature of the components assembly and packaging may be in accordance with copending application Ser. No. 533,405, filed Dec. 16, 1974, by J. G. Mitchell and assigned to the present assignee, now U.S. Pat. No. 4,059,849, issued Nov. 22, 1977.

The present invention has been developed with a particular intention to provide a small lightweight device that is suitable for aerospace applications or which may be subjected to severe environmental conditions. The invention is, of course, not so limited and where space and durability considerations are not so critical, it may take other forms while retaining the advantages of providing a single control logic circuit with the capability through selectable interconnecting external terminals to provide the various functions of the relay including normally open, normally closed and latched in single or two pole configurations.

The general principles of this invention are, for example, applicable to AC, as well as DC, power relays. An AC version would require merely an AC Power Switching Circuit with a DC power supply for the Control Logic Circuit in accordance with this invention. The AC Power Switching Circuit may be selected from various known forms with the Control Logic Circuit supplying gating signals.

I claim:

1. A control logic circuit capable of controlling the operation of a solid state relay in any one of a plurality of modes of operation, said circuit comprising:

threshold sensing means for responding to an input voltage signal of a given polarity and at least a given magnitude by producing a logic signal of a relatively fixed, predetermined magnitude that follows the input in polarity;

a logic gate having a first input terminal operatively connected to receive said logic signal from said threshold sensing means and a second input terminal, said second input terminal having a fixed interconnection to means for generating a first signal changing in logic state only upon a predetermined change in the waveform of said logic signal from said threshold sensing means, means for selectively overriding said first signal comprising a line connected to said second input terminal with an externally available MODE terminal on said line, said logic gate also having an output terminal providing an output signal for operation of a solid state relay; said MODE terminal requiring no connection for an output signal from said logic gate to provide latching type operation of the relay.

2. A control logic circuit as in claim 1 wherein: said MODE terminal is connected to a system line potential point to override said first signal and to cause said logic gate output signal to produce normally open relay operation.

3. A control logic circuit as in claim 1 wherein: said MODE terminal is connected to a system power ground potential point to override said first signal and to cause said logic gate output signal to produce normally closed relay operation.

4. A control logic circuit in accordance with claim 1 wherein: said logic gate has an output terminal that is connected to an input terminal of an auxiliary logic gate which has another input terminal for connection to a line potential point, said auxiliary logic gate having an output terminal for connection to a control logic circuit of a second solid state relay.

5. A control logic circuit in accordance with claim 1 wherein: said first input terminal of said logic gate also has connected thereto an external terminal for receiving a logic signal from a control logic circuit of a second solid state relay.

6. A solid state relay comprising a power switching circuit connectable between a line and a load and a control logic circuit in accordance with claim 1 whose output signal controls the operation of said power switching circuit.

7. A solid state relay in accordance with claim 6 wherein: said power switching circuit, said control logic circuit, and a control input circuit are contained within a unitary package having external terminals for connection respectively to line, load, power ground, control input and control ground points, in addition to said MODE terminal, for selective connection to determine the mode of relay operation.

8. A solid state relay in accordance with claim 7 wherein: said unitary package further has a master output terminal available for connection to supply a signal to a control logic circuit of a second solid state relay and a slave input terminal available for connection to receive a signal from a control logic circuit of a second solid state relay.

* * * * *